(12) United States Patent
Forcet (10) Patent No.: US 10,546,675 B2
(45) Date of Patent: Jan. 28, 2020

(54) METHOD FOR DETECTING A FAULT IN A RECLOSER

(71) Applicant: Schneider Electric Industries SAS, Rueil-Malmaison (FR)

(72) Inventor: Remi Forcet, Macquarie Park (AU)

(73) Assignee: Schneider Electric Industries SAS, Rueil-Malmaison (FR)

( * ) Notice: Subject to any disclaimer, the term of this patent is extended or adjusted under 35 U.S.C. 154(b) by 253 days.

(21) Appl. No.: 15/388,206

(22) Filed: Dec. 22, 2016

(65) Prior Publication Data

US 2017/0207014 A1 Jul. 20, 2017

(30) Foreign Application Priority Data

Dec. 23, 2015 (AU) ................................ 2015905379

(51) Int. Cl.
| | |
|---|---|
| *H01F 7/06* | (2006.01) |
| *G01R 31/327* | (2006.01) |
| *H01F 7/08* | (2006.01) |
| *H02H 3/06* | (2006.01) |

(52) U.S. Cl.
CPC ......... *H01F 7/064* (2013.01); *G01R 31/3275* (2013.01); *H01F 7/081* (2013.01); *H02H 3/06* (2013.01)

(58) Field of Classification Search
CPC ..... G01R 31/3275; H01F 7/064; H01F 7/081; H02H 3/044; H02H 3/06
USPC .......................................... 361/79, 159, 206
See application file for complete search history.

(56) References Cited

U.S. PATENT DOCUMENTS

| | | | | |
|---|---|---|---|---|
| 3,940,663 A | | 2/1976 | Meier et al. | |
| 4,307,345 A | * | 12/1981 | Schoen | G01R 31/3272 324/424 |
| 4,535,409 A | * | 8/1985 | Jindrick | H02H 3/0935 307/132 E |
| 4,680,706 A | * | 7/1987 | Bray | H02H 3/06 307/132 EA |
| 5,912,604 A | * | 6/1999 | Harvey | H01H 33/6662 218/138 |
| 6,331,687 B1 | * | 12/2001 | Dunk | H01H 11/0062 218/140 |
| 6,476,599 B1 | * | 11/2002 | Czimmek | F01L 9/04 123/90.11 |

(Continued)

FOREIGN PATENT DOCUMENTS

DE 10 2014108107.2 * 6/2014 ........... G01R 15/183

OTHER PUBLICATIONS

Translation of DE 10 2014 108 107.2.*
Extended European Search Report for European Application No. 16206272.3 dated May 9, 2017.

*Primary Examiner* — Thienvu V Tran
*Assistant Examiner* — Nicolas Bellido
(74) *Attorney, Agent, or Firm* — Locke Lord LLP (57) ABSTRACT

A method for detecting a fault of an actuator of a recloser, the actuator controlled by a coil to move between a first position and a second position, the method including: controlling the coil to move the actuator from the first position to the second position; monitoring, for a period of time, either or both of a current flowing through the coil and a voltage across the coil when the actuator is moving from the first position to the second position; and detecting the fault when the monitored current or the monitored voltage fails a predetermined condition.

18 Claims, 9 Drawing Sheets

(56) References Cited

U.S. PATENT DOCUMENTS

| | | | |
|---|---|---|---|
| 2005/0270720 A1* | 12/2005 | Johnson, Jr. | G01R 31/3278 361/170 |
| 2006/0001497 A1* | 1/2006 | Minteer | H01H 47/226 331/139 |
| 2008/0036561 A1 | 2/2008 | Hartinger et al. | |
| 2009/0132180 A1* | 5/2009 | Pearce | F02D 41/20 702/38 |
| 2010/0201375 A1* | 8/2010 | Walker | G01R 31/06 324/546 |
| 2011/0046808 A1* | 2/2011 | Kellis | H01H 47/002 700/293 |
| 2014/0117911 A1* | 5/2014 | Lamprell | G01D 5/2241 318/490 |
| 2015/0116878 A1* | 4/2015 | Richard | H01H 1/0015 361/71 |
| 2016/0161559 A1* | 6/2016 | Ricci | H02P 29/027 361/93.1 |
| 2017/0199231 A1* | 7/2017 | Brunner | H01H 47/001 |
| 2017/0207014 A1* | 7/2017 | Forcet | H02H 3/044 |

* cited by examiner

METHOD FOR DETECTING A FAULT IN A RECLOSER

PRIORITY

This application claims priority to and benefit from Australian Provisional Patent Application No. 2015905379, filed on 23 Dec. 2015; the entire contents of the aforementioned application is hereby incorporated by reference for all purposes.

TECHNICAL FIELD

The present application relates to a recloser, and in a particular, to detecting a fault in a recloser.

BACKGROUND

Reclosers, also known as autoreclosers, are used in electric power distribution systems or networks. A recloser functions like a circuit breaker, but with the ability to automatically close the breaker after the breaker has been opened due to a fault in supplying or distributing power, for example, when one or more power distribution lines connected to the recloser are short circuited. Some faults are only momentary, such as a falling tree branch hitting a power distribution line. Without a recloser, a fault causing the breaker to open will require a manual reset. This is time consuming, and will cause wide-spread inconvenience due to power failure. A recloser allows automatic closing of the breaker after the breaker is opened. This is to test whether the fault is momentary. For example, during a thunderstorm, if lightning were to strike the distribution system, the power to one's home may be disrupted for a few seconds causing lights and appliances to turn OFF (recloser opening), then ON (recloser closing). Once the recloser closes, if it senses the continued presence of increased current, it will again open. Such cycling between open and closed may occur a few times, usually three times, before the recloser remains open. These sequences of operation are called "reclose sequences".

During "reclose sequences", the recloser must be able to open very quickly after closing (usually less than 73 ms (time required for the DC component of the fault current to drop to 20% of its initial value), in order to comply with standard IEC 62271-100.

Reclosers are usually mounted to the poles or towers which suspend power lines above the ground. Use of reclosers in underground systems is also known.

SUMMARY

According to a first aspect, there is provided a method for detecting a fault of an actuator of a recloser, the actuator controlled by a coil to move between a first position and a second position, the method including: controlling the coil to move the actuator from the first position to the second position; monitoring, for a period of time, either or both of a current flowing through the coil and a voltage across the coil when the actuator is moving from the first position to the second position; and detecting the fault when the monitored current or the monitored voltage fails a predetermined condition.

In one form, the first position is an open position during which the actuator breaks a power supply through the recloser, and the second position is a closed position during which the actuator allows the power supply. In one form, the fault is a failure of the actuator to move from the first positon to the second position or a failure to maintain the second position despite being controlled by the coil to move to the second position. In one form, the failure further includes the actuator moving to the first position despite being controlled by the coil to move to the second position. In one form, the step of monitoring includes: monitoring a back EMF induced across the coil due to the movement of the actuator. In one form, the predetermined condition is the back EMF above a predetermined value after a predetermined time or the back EMF above a predetermined value continuously for a predetermined time. In one form, the predetermined time is 20 ms.

In one form, the method further including: preventing further control of the coil after detecting the fault for a period of recovery time. In one form, the period of recovery time is 100 ms after the end of a control signal applied to the coil to move the actuator from the first position to the second position. In one form, the period of recovery time ends after the voltage across the coil returns to zero.

In one form, a voltage of a first polarity is applied to the coil to move the actuator from the first position to the second position, and a voltage of a polarity opposite to the first polarity is applied to the coil to move the actuator from the second position to the first position. In one form, the period of time is a duration with length between 20 ms to 150 ms.

In one form, the recloser includes a first actuator and a second actuator, the first actuator for tripping the recloser to break a power supply through the recloser and the second actuator for closing the recloser to allow the power supply.

According to a second aspect, there is provided a recloser control system including: a recloser with one or more actuators each controlled by a respective coil to move between a first position and a second position; and a processor for monitoring, for a period of time, either or both of a current flowing through a coil and a voltage across the coil when the respective actuator is moving from the first position to the second position; and for detecting a fault when the monitored current or the monitored voltage fails a predetermined condition. In one form, the recloser includes a first actuator and a second actuator, the first actuator for tripping the recloser to break a power supply through the recloser and the second actuator for closing the recloser to allow the power supply.

According to a third aspect, there is provided a power distribution system including a plurality of the recloser control system of the second aspect.

According to a fourth aspect, there is provided a non-transitory computer readable medium including instructions to perform the method of the first aspect.

BRIEF DESCRIPTION OF DRAWINGS

Various embodiments will be discussed with reference to the accompanying drawings wherein.

DESCRIPTION OF EMBODIMENTS

It was observed that reclosers will suffer a fault within themselves when the breaker within the recloser fails to function properly. In particular, it was noted that the breaker may fail to close despite being controlled to be closed. This happens when an actuator of the breaker attempts to move to a close position from an open position, but fails to latch on the close position (de-latch). In some instances, the actuator moves back to the open position. This "de-latch" problem may be caused by mechanism failure of the actuator or due to unintended extra friction against the movement of the actuator due to old age or misalignment etc.

To further explain the problem of "de-latch", a particular type of recloser is selected as an example. In this example, the recloser includes three actuators, one per phase. Each actuator is a bi-polar single coil actuator. The signal used for opening is of the opposite polarity from the one for closing. Note that the various aspects described herein are not only applicable to this particular type of recloser. Other examples include, but not limited to, a recloser with twin coil actuator systems, and a triple-single recloser etc.

The recloser of this particular example operates with a single coil actuator that latches into close position using a permanent magnet. It requires a positive voltage to close and a negative voltage to trip. During a de-latch, the actuator moves towards the close position, fails to latch and goes back into the open position. During "reclose sequences", the actuator is controlled to move between close and open positions. If a de-latch occurs during "reclose sequences", the controller of the actuator may be damaged when trying to control the actuator to move to the open position when the actuator is not at the close position. Depending on the types or models of the controller, some controllers may not be able to cope with the energy of the actuator moving one way while sending a control signal to move the other way as the energy required could be more than double that of a normal operation.

In one configuration, during a normal operation, a "close" command will move the actuator to the close position. It takes, for example, 35 ms for the actuator to reach its close position. When the actuator reaches its close position, the "close" command can be terminated. However, the "close" command can be arranged to last even after the actuator has reached its close position. For example, the "close" command can last for a total of 65 ms. This is to ensure that reclosers of different ages can operate correctly under different conditions, such as different temperature, humidity etc. When the "close" command stops (i.e. no more supply of current to the coil), there is some remaining current in the coil. With the coil being an inductor, there will be a back EMF, the back EMF will last for <20 ms in normal operation. Accordingly, monitoring the back EMF can determine whether the actuator is working properly as a detection of back EMF of <20 ms indicates that the actuator is working properly. Note that the times of 35 ms, 65 ms, 20 ms mentioned in this paragraph are examples only and can be varied depending on the design.

In contrast, during a faulty operation, the back EMF can be >20 ms if the back EMF during a normal operation is <20 ms. Similar to a normal operation, there will be also back EMF at the end of the "close" command. However, as the actuator experiences a de-latch, the actuator moves back to the open position. The movement of the actuator will also cause back EMF. Thus back EMF will be detected even after 20 ms. Based on this, the de-latch fault can be detected.

It is known that limit switches are capable of detecting the position of an actuator within a recloser, whether the actuator is in the open or close position. However, long delays are required to filter the signal given by those limit-switches due to the vibrations caused by the heavy moving parts. Accordingly, embodiments, which do not involve any limit switches, avoid the limitations of limit switches.

Figure 1:
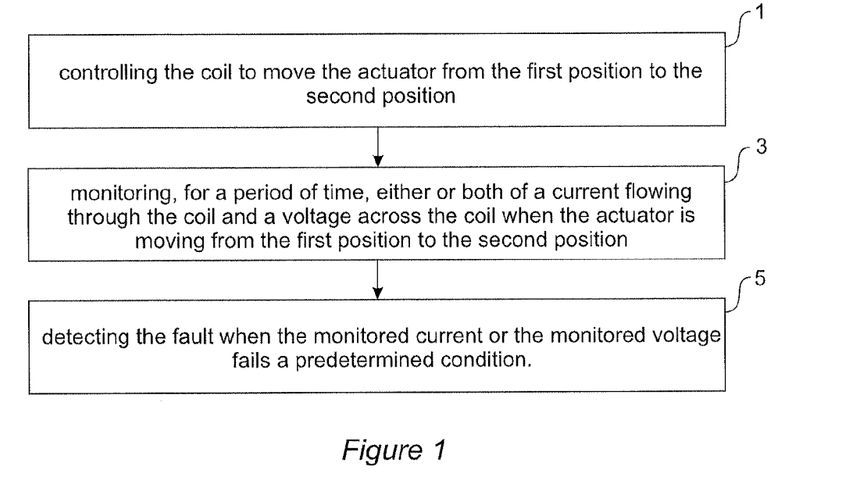
FIG. 1 shows steps involved in an embodiment to detect a fault at a recloser.

FIG. 1 depicts steps involved in one embodiment to detect a fault at a recloser. In this particular embodiment, the recloser may include one or more breakers, each breaker controlled by an actuator. The actuator is controlled by a coil to move between at least two positions. In a first position, the actuator causes the breaker to open, which effectively disrupts a power supply through the recloser. In a second position, the actuator causes the breaker to close, which effectively allows a power supply through the recloser.

Referring back to FIG. 1, in the first step 1, a coil, as described above, is controlled to move the actuator from the first position to the second position. In the second step 3, either or both of a current flowing through the coil and a voltage across the coil when the actuator is moving from the first position to the second position are monitored. Note that it is not necessary to monitor the current flowing through the coil or the voltage across the coil all the time when the actuator moves from the first position to the second position. It is only necessary to monitor the current flowing through the coil or the voltage across the coil for a period of time when the actuator moves from the first position to the second position. For example, in some embodiments, the length of the monitoring duration can be of any length between 20 ms to 150 ms. In one example, the monitoring duration is 20 ms. More discussion on the period of time will be presented with reference to FIGS. 6 and 7. After the monitoring of step 3, step 5 is performed. In this step, a fault is detected when the monitored current or the monitored voltage fails a predetermined condition. For example, if a back EMF is detected after a given time, say 20 ms accordingly to one example, then there is a fault. Other examples may include the monitored current exceeding a certain level to indicate a fault has occurred, or the monitored voltage exceeding a certain level to indicate a fault has occurred. More complex conditions may be set, such as the monitored voltage exceeding a certain level after a certain time after a coil has caused the actuator to move from a position to another position. Alternatively, the condition can be the back EMF above a predetermined value after a predetermined time or the back EMF above a predetermined value continuously for a predetermined time. In another form, the actuator current or voltage waveform (including back EMF) should be within an acceptable deviation from a predetermined waveform.

For clarity, a "fault" is either related to the primary circuit of the switchgear (MV line), or is related to the circuit powering the actuator. When a "fault" related to the primary circuit is detected, the actuator of a recloser acts like a circuit breaker to break the circuit and will also automatically attempt to close the breaker. The "fault" in the actuator is when the actuator is not functioning properly, for example due to issues with the drive circuit of the actuator etc.

Figure 2:
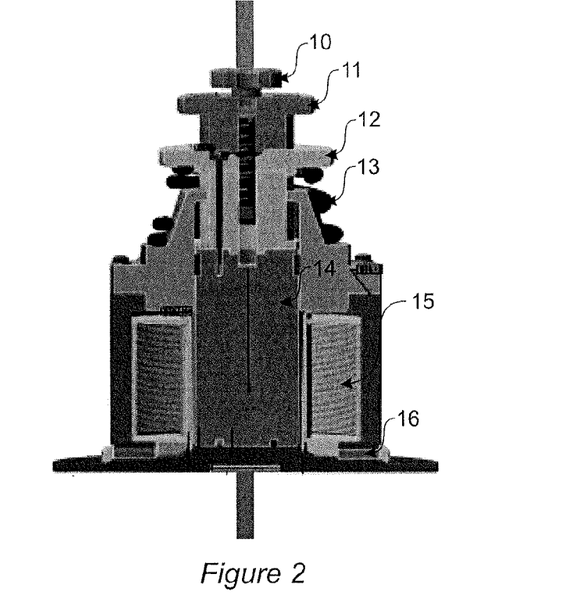
FIG. 2 illustrates an actuator within an exemplary recloser.

FIG. 2 depicts an actuator mechanism within a recloser which is monitored by a recloser monitoring system according to one embodiment. In this embodiment, for a close operation, the coil 15 is powered to move the core of the actuator 14 until it latches to permanent magnets 16. During the close operation, spring 13 is compressed to reduce the energy required for the trip (open) operation. For the trip operation, a smaller current is required in the opposite polarity, to move the core from the permanent magnets by negating the field of the permanent magnets. Parts 10, 11, 12 are parts connected to the core 14 and move together with core 14. FIG. 2 shows the core 14 at the close position. Parts 10, 11, 12, and 14 moves upward with reference to FIG. 2 to an open position (not shown) to disconnect an electricity supply through the recloser. During a close signal, the controller acts as a generator of the close signal. At the end of the close signal generated by the controller, the actuator acts as an inductor, and will keep the remaining current flowing for a short time. In other words, the actuator acts as a generator for a short period of time (<20 ms in one example). The voltage will be of opposite sign to the close signal generated by the controller for a period of <20 ms. This energy is known as back EMF. In case of a de-latch fault, the actuator will be a generator for much longer as it moves back to the open position, and it will effectively become a dynamo. The energy created by the actuator moving is also called back EMF, but it is really the dynamo effect. If the total back EMF is more than 20 ms, then it can be assumed that there was a de-latching fault of an actuator.

Figure 3:
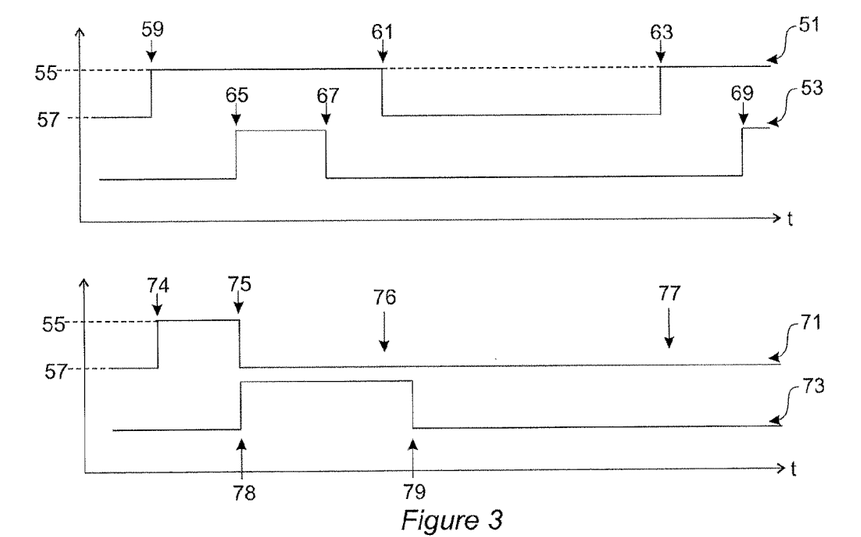
FIG. 3 depicts a chronogram of a working and a faulty recloser without de-latch protection according to any of the embodiments described herein.

FIG. 3 depicts a chronogram of a working and a faulty recloser without de-latch protection according to any of the embodiments described herein. The top part of FIG. 3 shows a situation when the actuator is operating properly; while the bottom part of FIG. 3 shows a situation when there is a fault. Referring to the top part of FIG. 3, trace 51 represents the status of a recloser. Level 55 represents a closed status, and level 57 represents an opened status. Note that the status of the recloser is not indicative of the position of a respective actuator. When a recloser status changes to closed status, a command is sent to move the respective actuator to the close position. However the movement takes time, often within 30 to 50 ms. Trace 53 represents current induced in the coil. At time 59, the controller sends a signal to the coil (for example, by providing a current of a certain direction) to cause the actuator to move from the open position to the close position. When the actuator reaches its close position and when the "close" command ends, a back EMF will be induced in the coil, from time 65 to 67. At time 61, the coil is controlled (for example, by providing a current of opposition direction) to move the actuator from the close position to the open position (when fault in the primary circuit providing power supply is detected). The actuator is controlled to move to the close position again at time 63 to attempt to recover the fault in the primary circuit in providing power supply. The back EMF again appears from time 69 when the actuator reaches its close position and after the "close" command ends. Referring to the bottom part of FIG. 3, trace 71 represents the status of a recloser. Trace 73 represents current induced in the coil. At time 74, the controller sends a signal to the coil (for example, by providing a current of a certain direction) to cause the actuator to move from the open position to the close position. When the actuator reaches its close position and when the "close" command ends, a current will be induced in the coil from time 78. However, this time, the actuator fails to latch at its close position despite being controlled to do so (de-latch fault) 75. Due to this de-latch fault, the current induced or back EMF will be above a certain level for a longer period of time as shown by trace 73, from time 78 to 79. At time 76, when a control to move the actuator to the open position will result in a failure as there will be presence of back EMF, and subsequent control to move the actuator (for example, to move the actuator to close position ay time 77) will not be fulfilled due to the failure.

Figure 4:
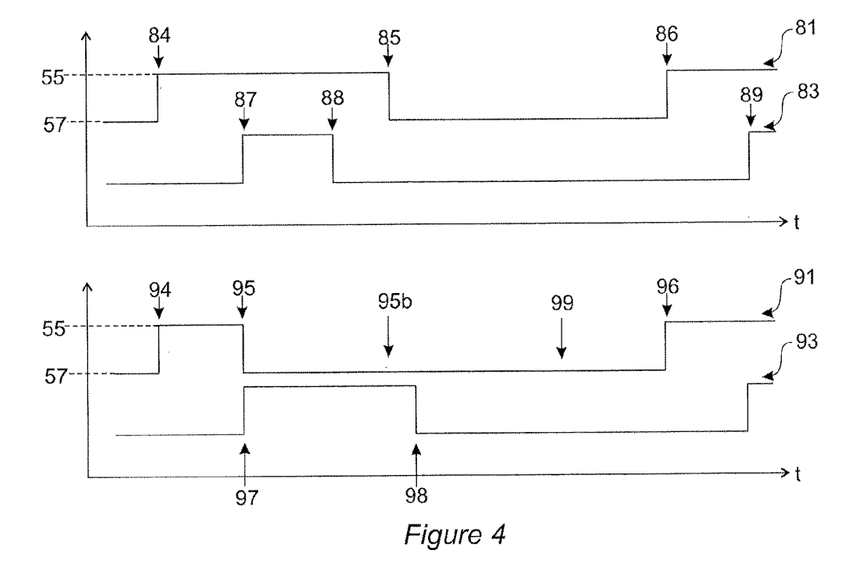
FIG. 4 depicts a chronogram of a working and a faulty recloser with de-latch protection according to one of the embodiments.

FIG. 4 depicts a chronogram of a working and a faulty recloser with de-latch protection according to an embodiments. The top part of FIG. 4 shows a situation when the actuator is operating properly; while the bottom part of FIG. 4 shows a situation when there is a fault. Referring to the top part, trace 81 represents the status of a recloser. Level 55 represents a close status, and level 57 represents an open status. Note that the status of recloser is not indicative of the position of a respective actuator as discussed previously. Trace 83 represents current induced in the coil. At time 84, the controller sends a signal to the coil (for example, by providing a current of a certain direction) to cause the actuator to move from the open position to the close position. When the actuator reaches its close position and when the "close" command ends, a current will be induced in the coil from time 87 to 88. During this time, because the actuator is working properly, the back EMF should not fail one or more of the predetermined conditions (for example <20 ms). At time 85, the coil is controlled (for example, by providing a current of an opposition direction) to move the actuator from the close position to the open position (when fault in the primary circuit in providing power supply is detected). The actuator is controlled to move to the close position again at time 86 to attempt to recover the fault in the primary circuit in providing power supply. The back EMF again appears from time 89 when the actuator reaches its close position and when the "close" command ends. Referring to the bottom part of FIG. 4, trace 91 represents the status of a recloser. Trace 93 represents current induced in the coil. At time 94, the controller sends a signal to the coil (for example, by providing a current of a certain direction) to cause the actuator to move from the open position to the close position. When the actuator reaches its close position and when the "close" command ends, a back EMF will be induced in the coil from time 97. However, this time, the actuator fails to latch at its close position despite being controlled to do so (de-latch fault) 95. Due to this de-latch fault, the current induced or back EMF will be above a certain level for a longer period of time as shown by trace 93, from 97 to 98. At time 95b, a control to move the actuator to the open position will be rejected, rather than result in a failure. For example, when the controller of the coil receives a command to control the coil to cause the movement of actuator to move to open position, such command will be overridden or ignored, as the monitoring of the back EMF according to various embodiments indicates that there is a fault at the actuator. In this example, after waiting for a period of time when there is no back EMF, the command to move to open will be accepted and effected (at time 99 for example when there is no back EMF). Accordingly, subsequent control to move the actuator (for example, to move the actuator to close position ay time 96) will be fulfilled. Thus, any risk of tripping the actuator when there is a back EMF is avoided.

In particular, if the controller attempts to trip a recloser when the actuators are generating a reverse polarity signal caused by de-latching (back EMF), it is likely to cause electronic damage. When the recloser closes when there is a fault, it could be required to open within 60 ms of the current starting to flow. In this situation, the controller would attempt to open as de-latch is occurring, and the electronics could become damaged. The various aspects described herein prevent tripping when actuators are de-latching. De-latching is also a sign that the switchgear is badly damaged and no longer reliable. In some embodiments an alarm is sent and recorded when de-latch occurs.

Figure 5:
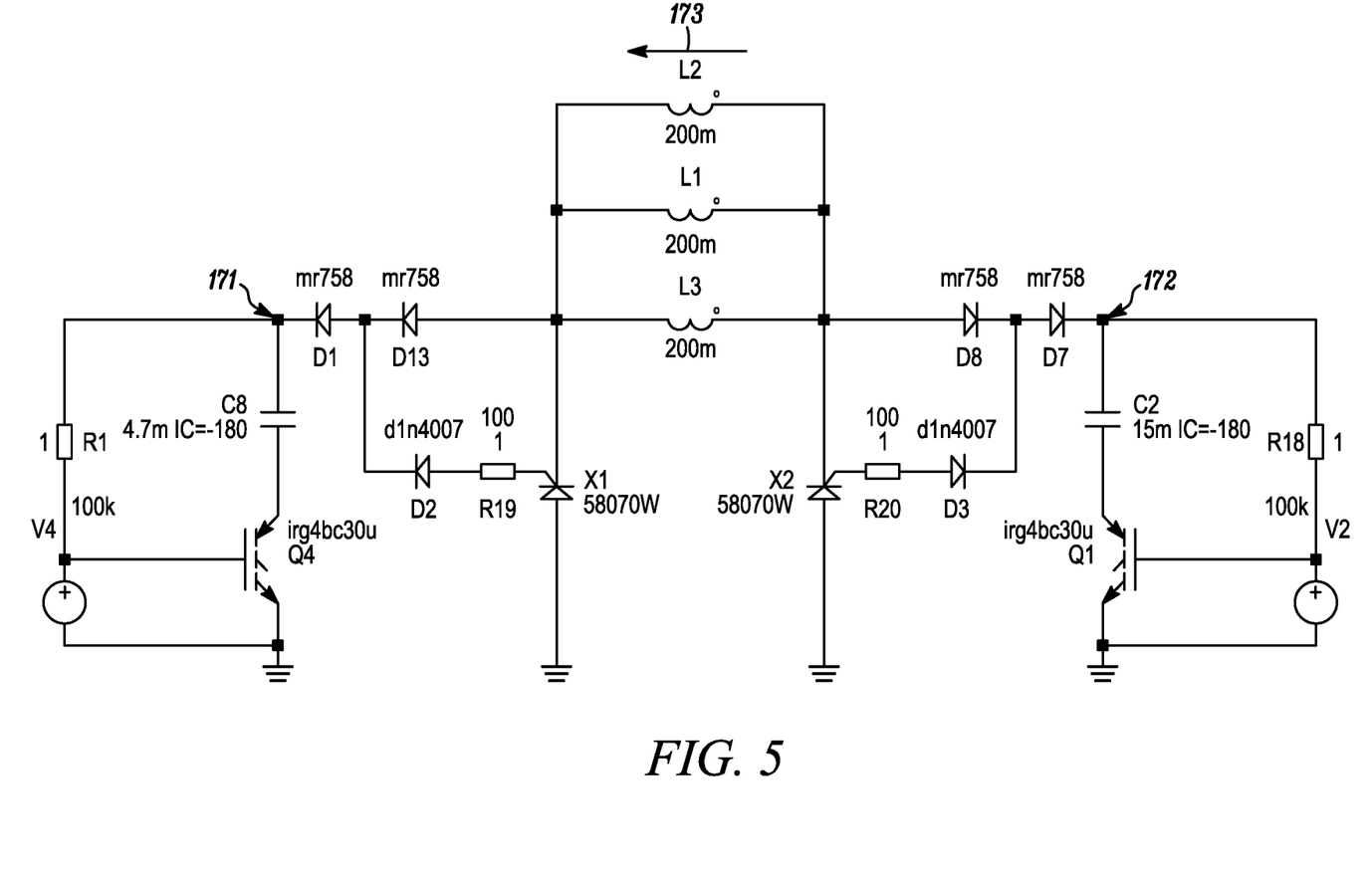
FIG. 5 depicts an exemplary circuit which is capable of controlling an actuator of a recloser.

FIG. 5 depicts an exemplary circuit to effect one embodiment. In this example, thyristors X1 and X2 are used, in conjunction with two insulated-gate bipolar transistors (IG-BTs) Q1 and Q4 and two capacitors C5 and C1. In this example, the recloser includes bi-polar single coil actuators. There are three actuators in one recloser, one per phase. The controls control the three actuators con-concurrently. Note that each actuator can be controlled separately in other embodiments.

Close signal at 172 is a negative voltage caused by Q1 discharging Capacitor C1 (15 mF) into actuators L1, L2 and L3. Voltage across actuators 173 is then positive. Trip signal at 171 is a negative voltage caused by Q4 discharging Capacitor C5 (4.7 mF) into actuators L1, L2 and L3. Voltage across actuators 173 is then negative. Right after opening Q1 (at the end of a close signal), the controller monitors close signal at 172 to make sure the back EMF voltage duration is less than 20 ms. If it is more than 20 ms, the controller alarms and any operations are disabled until the voltage is 0V.

Figure 6:
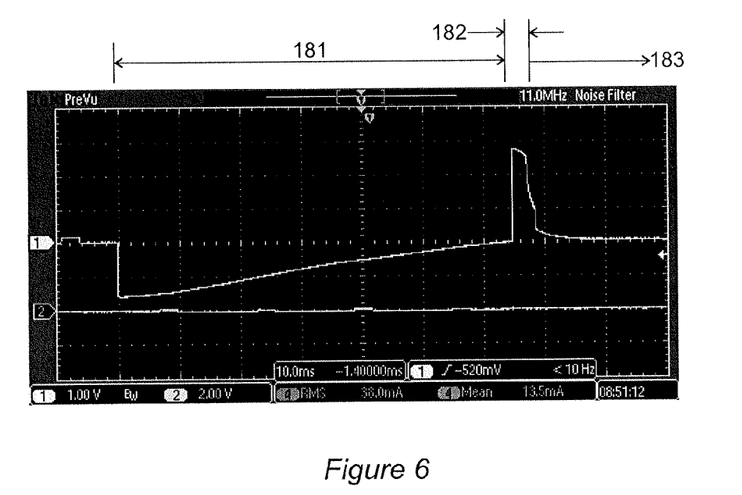
FIG. 6 depicts an oscillogram taken during normal operation of an actuator.

FIG. 6 depicts an oscillogram taken during normal operation of an actuator. FIG. 6 shows measured voltage but measurement of current is also possible. During a normal operation, a voltage is applied but will diminish gradually 181 as the actuator moves from one position to the other. At the end of the movement and when the "close" command ends, there will be a rapid change of the voltage 182 (which resembles a pulse). This is due to the back EMF caused by energy dissipation at the end of the operation. The duration of the back EMF is expected to be <20 ms in this embodiment. Other values such as 25 ms, 30 ms are also possible. This duration is dependent on the inductance of the coil driving an actuator and the impendence of the controller controlling the coil. After the back EMF, the voltage is substantially zero 183 thus a new command can be sent to activate the actuator again. Note that for this example, the actuator moves for 65 ms to be successfully latched on to the close position.

Figure 7:
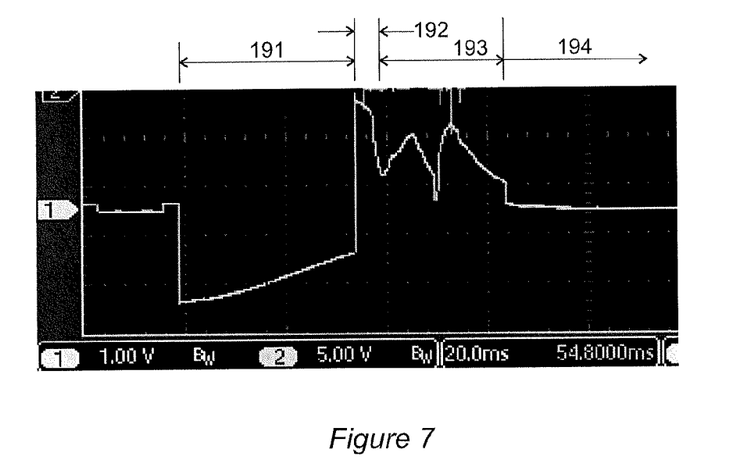
FIG. 7 depicts an oscillogram taken during de-latching of an actuator.

FIG. 7 depicts an oscillogram taken during de-latching (faulty operation) of an actuator. FIG. 7 shows measured voltage but measurement of current is also possible. Note that FIG. 7 is an artificially created faulty operation, by decreasing the close time to 35 ms (in contrast with the embodiment described with reference to FIG. 6 that a 65 ms is required to move a coil from open position to close position). This illustrates the same effect as a de-latch created by extra friction (i.e. the actuator fails to reach the desired position in time and moves back to the open position). In this example, a voltage is applied but will diminish gradually 191 as the actuator moves from one position to the other. At the end of the movement and when the "close" command ends, there will be a rapid change (beginning of 192), but the voltage does not return to substantially zero after 20 ms. Instead there will be some fluctuating voltage, as the actuators fail to latch on (i.e. maintain its position at the new position) to move back to the original position (due to the spring for example). At this time when there is back EMF, it may be disastrous to attempt to control the movement of the actuator. Thus, with the monitoring of the voltage, any further control can be prevented until the voltage has returned to substantially zero 194 eventually. If the so called voltage "pulse" is designed to last for <20 ms during a normal operation, then any detection of signal >20 ms later would be considered as a detection of a fault. An alarm can be raised. A timer can be initiated for the next measurement of voltage. Alternatively, voltage can be continually monitored until the voltage returns to substantially zero. In one embodiment, it is only required to monitor for 20 ms after the end of the close signal. In one embodiment, samples taken for various time points are also possible.

Figure 8:
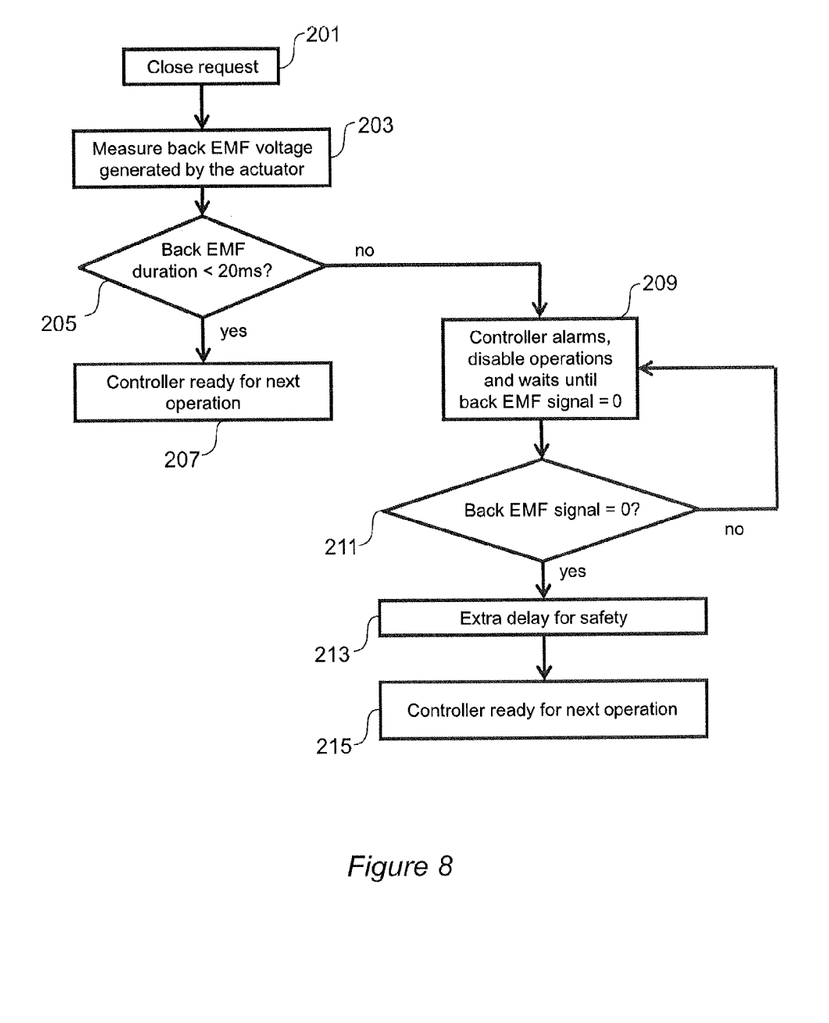
FIG. 8 shows a flow diagram in relation to operation of one embodiment to detect fault at a recloser and its response to the fault.

FIG. 8 shows a flow diagram in relation to operation of one embodiment to detect fault at a recloser and its response to the fault. When there is a close request 201, the back EMF voltage (can be current) generated by the actuator is measured 203 when the "close" command ends. If the back EMF no longer exists after 20 ms since the beginning of the back EMF 205, then a new command can be accepted (i.e. the controller is ready for next operation 207). Else, if the back EMF lasts for >20 ms, there will be an alarm, and further operation is disabled until back EMF is zero 209, 211. Once the back EMF returns to zero, an extra delay (such as 100 ms, 150 ms etc.) can be added as an extra safety precaution. After the delay, the controller is ready for next operation 215. By doing so, the fault/failure of the actuator has been addressed adequately.

Figure 9:
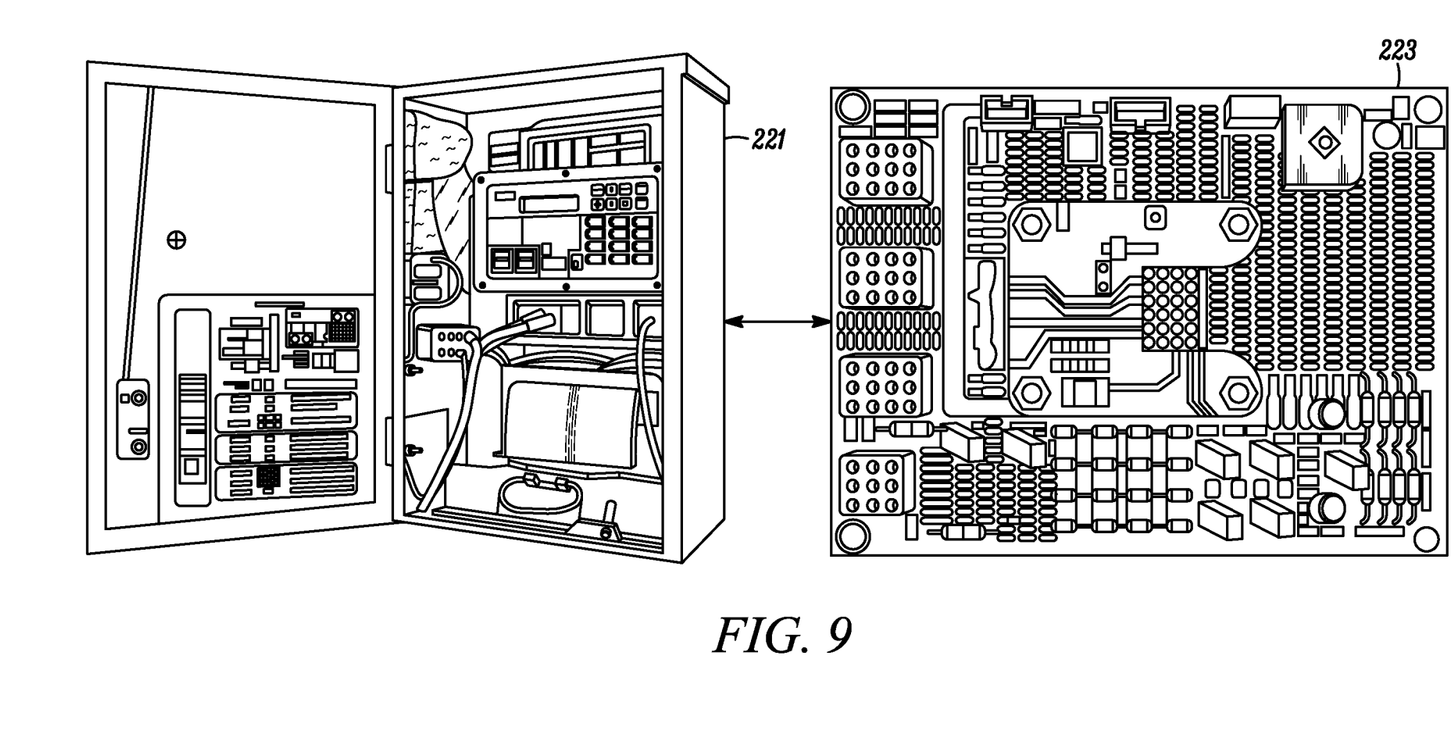
FIG. 9 shows an embodiment of a recloser control system.

FIG. 9 depicts a recloser control system. In this example, there is an Advanced Controller (ADVC) controller 221 connected to a switchgear cable entry module (SCEM) 223. The SCEM 223 can be positioned inside the recloser. When connected to a recloser, the ADVC controller 221 reads the SCEM 223 in the recloser and receives the information required to control and monitor the recloser adequately. The monitoring of the back EMF can be performed by the SCEM or the ADVC controller. The controller and the recloser would be damaged in case of a de-latch without protection offered by the various aspects described herein.

Figure 10:
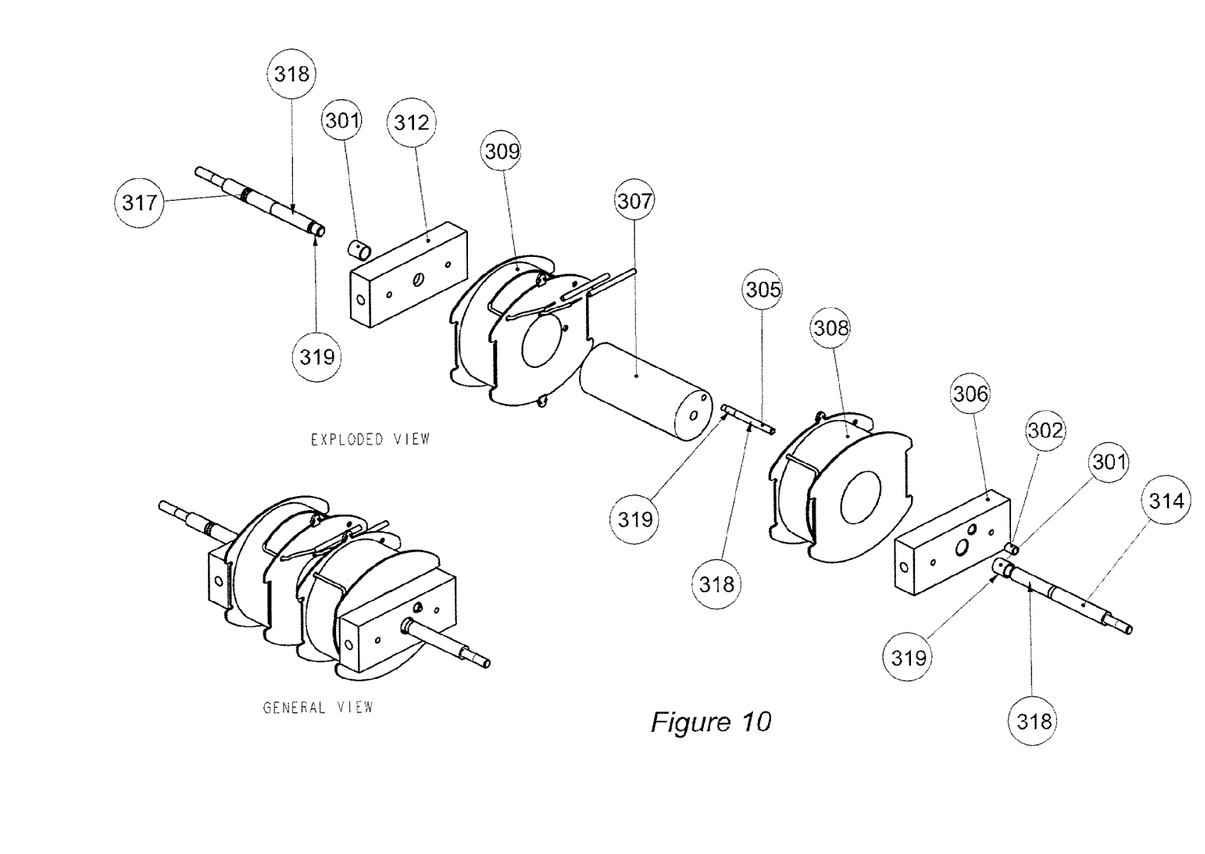
FIGS. 10 to 12 show an embodiment of a twin coil actuator system.
Figure 11:
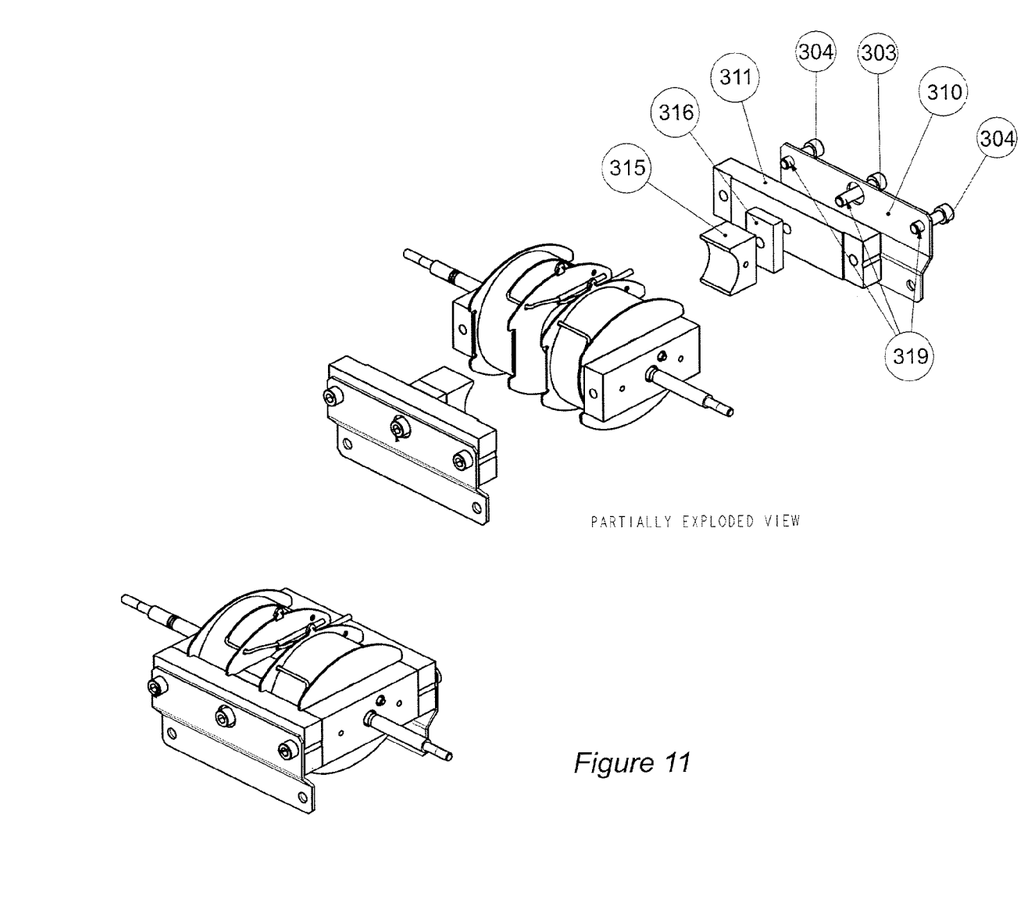
Figure 12:
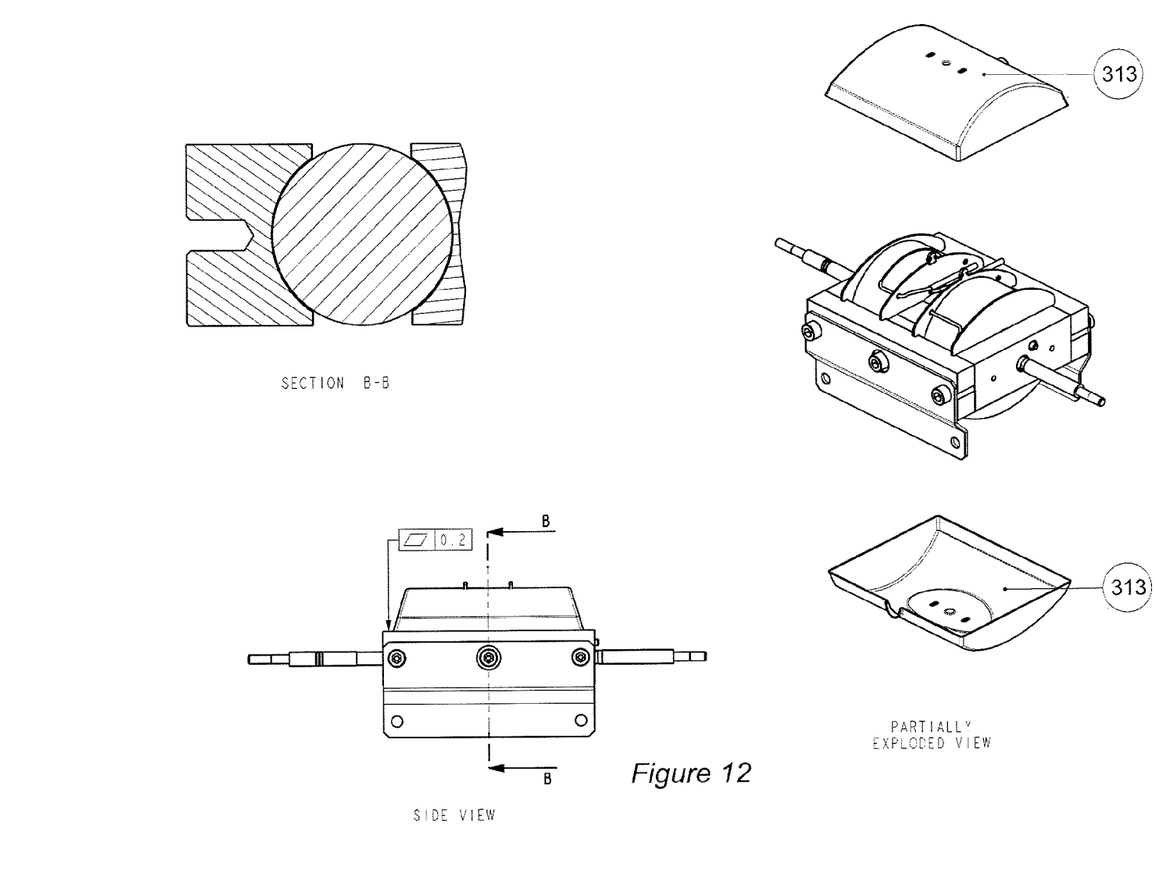

FIGS. 10 to 12 show an embodiment of an actuator for use in a recloser control system. In this embodiment, the parts are: glacier bush 301, glacier bush 302, cap crews, 303, 304, actuator alignment pin 305, actuator 3 yoke trip end 306, actuator armature round 307, trip coil 308, close coil 309, actuator bracket 310, actuator side 311, actuator yoke close end 312, actuator shroud 313, short actuator rod 314, magnet block 315, magnet 316, actuator rod close end 317, anti-scuffing paste 318 and adhesive/sealant such as Loctite 319. As can be seen, this actuator includes trip coil 308 and close coil 309 separately.

Those of skill in the art would understand that information and signals may be represented using any of a variety of technologies and techniques. For example, data, instructions, commands, information, signals, bits, symbols, and chips may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the embodiments disclosed herein may be implemented as electronic hardware, computer software or instructions, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the aspects described herein.

The steps of a method or algorithm described in connection with the embodiments disclosed herein may be embodied directly in hardware, in a software module executed by a processor, or in a combination of the two. For a hardware implementation, processing may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. Software modules, also known as computer programs, computer codes, or instructions, may contain a number a number of source code or object code segments or instructions, and may reside in any computer readable medium such as a RAM memory, flash memory, ROM memory, EPROM memory, registers, hard disk, a removable disk, a CD-ROM, a DVD-ROM, a Blu-ray disc, or any other form of computer readable medium. In some aspects the computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media. In another aspect, the computer readable medium may be integral to the processor. The processor and the computer readable medium may reside in an ASIC or related device. The software codes may be stored in a memory unit and the processor may be configured to execute them. The memory unit may be implemented within the processor or external to the processor, in which case it can be communicatively coupled to the processor via various means as is known in the art.

Further, it should be appreciated that modules and/or other appropriate means for performing the methods and techniques described herein can be downloaded and/or otherwise obtained by computing device. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a computing device can obtain the various methods upon coupling or providing the storage means to the device. Moreover, any other suitable technique for providing the methods and techniques described herein to a device can be utilized.

In one form one aspect may comprise a computer program product for performing the method or operations presented herein. For example, such a computer program product may comprise a computer (or processor) readable medium having instructions stored (and/or encoded) thereon, the instructions being executable by one or more processors to perform the operations described herein. For certain aspects, the computer program product may include packaging material.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The system may be a computer implemented system comprising of a display device, a processor and a memory and an input device. The memory may comprise instructions to cause the processor to execute a method described herein. The processor memory and display device may be included in a standard computing device, such as a desktop computer, a portable computing device such as a laptop computer or tablet, or they may be included in a customised device or system. The computing device may be a unitary computing or programmable device, or a distributed device comprising several components operatively (or functionally) connected via wired or wireless connections. An embodiment of a computing device comprises a central processing unit (CPU), a memory, a display apparatus, and may include an input device such as keyboard, mouse, etc. The CPU comprises an Input/Output Interface, an Arithmetic and Logic Unit (ALU) and a Control Unit and Program Counter element which is in communication with input and output devices (eg input device and display apparatus) through the Input/Output Interface. The Input/Output Interface may comprise a network interface and/or communications module for communicating with an equivalent communications module in another device using a predefined communications protocol (e.g. Bluetooth, Zigbee, IEEE 802.15, IEEE 802.11, TCP/IP, UDP, etc). A graphical processing unit (GPU) may also be included. The display apparatus may comprise a flat screen display (eg LCD, LED, plasma, touch screen, etc), a projector, CRT, etc. The computing device may comprise a single CPU (core) or multiple CPU's (multiple core), or multiple processors. The computing device may use a parallel processor, a vector processor, or be a distributed computing device. The memory is operatively coupled to the processor(s) and may comprise RAM and ROM components, and may be provided within or external to the device. The memory may be used to store the operating system and additional software modules or instructions. The processor(s) may be configured to load and executed the software modules or instructions stored in the memory.

Throughout the specification and the claims that follow, unless the context requires otherwise, the words "comprise" and "include" and variations such as "comprising" and "including" will be understood to imply the inclusion of a stated integer or group of integers, but not the exclusion of any other integer or group of integers.

The following are example, non-limiting embodiments of the disclosure: Embodiment 1A is a processor-implemented method, comprising: detecting, via at least one processor, a fault of an actuator of a recloser, the actuator controlled by a coil to move between a first position and a second position, the detecting including: controlling the coil to move the actuator from the first position to the second position; monitoring, for a period of time, at least one of (a) a current flowing through the coil and/or (b) a voltage across the coil when the actuator is moving from the first position to the second position; defining a detected fault when the monitored current or the monitored voltage fails a predetermined condition; and outputting the detected fault. Embodiment 2A is the processor-implemented method of embodiment 1A, wherein the first position is an open position during which the actuator breaks a power supply through the recloser, and the second position is a closed position during which the actuator allows the power supply. Embodiment 3A is the processor-implemented method of embodiment 1A, wherein the fault is a failure of the actuator to move from the first positon to the second position or a failure to maintain the second position despite being controlled by the coil to move to the second position. Embodiment 4A is the processor-implemented method of embodiment 3A, wherein the failure further includes the actuator moving to the first position despite being controlled by the coil to move to the second position. Embodiment 5A is the processor-implemented method of embodiment 1A, wherein the step of monitoring includes: monitoring a back EMF induced across the coil due to the movement of the actuator. Embodiment 6A is the processor-implemented method of embodiment 5A, wherein the predetermined condition is the back EMF above a predetermined value after a predetermined time or the back EMF above a predetermined value continuously for a predetermined time. Embodiment 7A is the processor-implemented method of embodiment 6A, wherein the predetermined time is 20 ms. In embodiment 8A, the processor-implemented method of embodiment 1A further includes: preventing further control of the coil after detecting the fault for a period of recovery time. Embodiment 9A is the processor-implemented method of embodiment 8A, wherein the period of recovery time is 100 ms after the end of a control signal applied to the coil to move the actuator from the first position to the second position. Embodiment 10A is the processor-implemented method of embodiment 9A, wherein the period of recovery time ends after the voltage across the coil returns to zero. Embodiment 11A is the processor-implemented method of embodiment 1A, wherein a voltage of a first polarity is applied to the coil to move the actuator from the first position to the second position, and a voltage of a polarity opposite to the first polarity is applied to the coil to move the actuator from the second position to the first position. Embodiment 12A is the processor-implemented method of embodiment 1A, wherein the recloser includes a first actuator and a second actuator, the first actuator for tripping the recloser to break a power supply through the recloser and the second actuator for closing the recloser to allow the power supply. Embodiment 13A is the processor-implemented method of embodiment 1A, wherein the period of time is between 20 ms to 150 ms. Embodiment 1B is a non-transitory processor-readable medium comprising instructions that, when executed by at least one processor, cause the processor to perform the method of any one of embodiments 1A through 13A.

Embodiment 14A is a recloser control system comprising: a recloser with one or more actuators each controlled by a respective coil to move between a first position and a second position; and a processor configured to: (1) monitor, for a period of time, at least one of (a) a current flowing through a coil and/or (b) a voltage across the coil when the respective actuator is moving from the first position to the second position; and (2) detect a fault when the monitored current or the monitored voltage fails a predetermined condition. Embodiment 15A is the recloser control system of embodiment 14A, wherein the recloser includes a first actuator and a second actuator, the first actuator configured to trip the recloser to break a power supply through the recloser and the second actuator configured to close the recloser to allow the power supply.

Embodiment 16A is a power distribution system including a plurality of recloser control systems, each control system comprising: a recloser with one or more actuators each controlled by a respective coil to move between a first position and a second position; and a processor configured to: (1) monitor, for a period of time, at least one of (a) a current flowing through a coil and/or (b) a voltage across the coil when the respective actuator is moving from the first position to the second position; and (2) detect a fault when the monitored current or the monitored voltage fails a predetermined condition.

The reference to any prior art in this specification is not, and should not be taken as, an acknowledgement of any form of suggestion that such prior art forms part of the common general knowledge.

It will be appreciated by those skilled in the art that the various aspects are not restricted in their use to the particular application described. Neither are they restricted in the embodiments described with regard to the particular elements and/or features described or depicted herein. It will be appreciated that the various aspects are not limited to the embodiment or embodiments disclosed, but is capable of numerous rearrangements, modifications and substitutions without departing from the scope as set forth and defined by the following claims.

The following claims are not intended to limit the scope of what may be claimed in any future patent applications based on the present application. Integers may be added to or omitted from the example claims at a later date so as to further define or re-define the various aspects.

The invention claimed is:

1. A method for detecting a fault of an actuator of a recloser, the actuator controlled by a coil to move between a first position and a second position, the method comprising:
controlling the coil to move the actuator from the first position to the second position;
monitoring, for a period of time, either or both of a current flowing through the coil and a voltage across the coil when the actuator is moving from the first position to the second position;
detecting the fault when the monitored current or the monitored voltage fails a predetermined condition; and
preventing further control of the coil after detecting the fault for a period of recovery time.

2. The method of claim 1,
wherein the step of monitoring includes:
monitoring a back EMF induced across the coil due to movement of the actuator when controlling the coil to move the actuator from the first position to the second position has ended; and
wherein the step of detecting includes:
detecting the fault when the monitored back EMF fails a predetermined condition.

3. The method of claim 2, wherein the predetermined condition is the back EMF above a predetermined value after a predetermined time or the back EMF above a predetermined value continuously for a predetermined time, indicating a failure of the actuator to latch on the second position despite having been controlled by the coil to move to the second position.

4. The method of claim 3, wherein the predetermined time is 20 ms.

5. The method of claim 1, wherein the period of recovery time is 100 ms after the end of a control signal applied to the coil to move the actuator from the first position to the second position.

6. The method of claim 5, wherein the period of recovery time ends after the voltage across the coil returns to zero.

7. The method of claim 1, wherein a voltage of a first polarity is applied to the coil to move the actuator from the first position to the second position, and a voltage of a polarity opposite to the first polarity is applied to the coil to move the actuator from the second position to the first position.

8. The method of claim 1, wherein the recloser includes a first actuator and a second actuator, the first actuator for tripping the recloser to break a power supply through the recloser and the second actuator for closing the recloser to allow the power supply.

9. The method of claim 1, wherein the period of time is between 20 ms to 150 ms.

10. The method of claim 1,
wherein the first position is an open position during which the actuator breaks a power supply through the recloser, and the second position is a closed position during which the actuator allows the power supply.

11. The method of claim 1, wherein the fault is a failure of the actuator to move from the first position to the second position or a failure to maintain the second position, despite being controlled by the coil to move to the second position.

12. The method of claim 11, wherein the failure further includes the actuator moving to the first position despite being controlled by the coil to move to the second position.

13. A computer program product comprising a none transitory computer readable medium having instructions stored thereon, which when executed by one or more processors cause the one or more processors to perform the method of claim 1.

14. A recloser control system, comprising:
a recloser with one or more actuators each controlled by a respective coil to move between a first position and a second position; and
a processor configured to monitor, for a period of time, either or both of a current flowing through a coil and a voltage across the coil when the respective actuator is moving from the first position to the second position, detect a fault when the monitored current or the monitored voltage fails a predetermined condition, and prevent further control of the coil after detecting the fault for a period of recovery time.

15. The recloser control system of claim 14, wherein the period of recovery time is 100 ms after the end of a control signal applied to the coil to move the actuator from the first position to the second position.

16. The recloser control system of claim 15, wherein the period of recovery time ends after the voltage across the coil returns to zero.

17. The recloser control system of claim 14, wherein the recloser includes a first actuator and a second actuator, the first actuator for tripping the recloser to break a power supply through the recloser and the second actuator for closing the recloser to allow the power supply.

18. A power distribution system comprising a plurality of the recloser control system of claim 14.

* * * * *